United States Patent [19]
Yasunaga et al.

[11] Patent Number: 5,853,533
[45] Date of Patent: Dec. 29, 1998

[54] WAFER SLICE BASE PEELING SYSTEM

[75] Inventors: Masaaki Yasunaga; Takeshi Kagamida, both of Mitaka, Japan

[73] Assignee: Tokyo Seimitsu Co., LTD., Tokyo, Japan

[21] Appl. No.: 27,207

[22] Filed: Feb. 20, 1998

Related U.S. Application Data

[62] Division of Ser. No. 835,637, Apr. 10, 1997, Pat. No. 5,759,344, which is a division of Ser. No. 398,179, Mar. 2, 1995, abandoned.

[30] Foreign Application Priority Data

Mar. 22, 1994 [JP] Japan ..................................... 6-075286
Jun. 20, 1994 [JP] Japan ..................................... 6-162824

[51] Int. Cl.⁶ ....................................................... B32B 35/00
[52] U.S. Cl. ......................... 156/584; 29/426.5; 156/344
[58] Field of Search ..................... 156/344, 584; 29/426.1, 426.3, 426.5; 118/101; 269/290, 292

[56] References Cited

U.S. PATENT DOCUMENTS

| | | |
|---|---|---|
| 4,537,244 | 8/1985 | Holden . |
| 4,921,564 | 5/1990 | Moore . |
| 5,240,882 | 8/1993 | Satoh et al. . |
| 5,427,644 | 6/1995 | Nagatsuka et al. . |
| 5,578,167 | 11/1996 | Sooriakumar et al. . |
| 5,656,127 | 8/1997 | De Niel et al. . |

FOREIGN PATENT DOCUMENTS

| | | |
|---|---|---|
| 56-127335 | 2/1981 | Japan . |
| 64-61247 | 3/1989 | Japan . |
| A-5-6882 | 1/1993 | Japan . |
| A-6-208978 | 7/1994 | Japan . |

*Primary Examiner*—Mark A. Osele
*Attorney, Agent, or Firm*—Oliff & Berridge, PLC

[57] ABSTRACT

The hot water is stored in the hot-water tank and kept at the predetermined temperature. The clamp base is provided in the hot water of the hot-water tank for receiving the substrate portion of the wafer and the lifter is arranged for moving the wafer from the upper part of the hot-water tank into the hot water. The clamper is placed at the upper of the clamp base and the substrate portion of the wafer is pushed to the clamp base fixedly and the pusher is arranged at the upper side of the clamp base in the vicinity of the clamper so as to push the slice base of the wafer, whereby the slice base is peeled. The peeling is performed in the hot water, therefore, the temperature of the wafer does not lower while peeling, so that the adhesive can be peeled easily.

3 Claims, 12 Drawing Sheets

WAFER SLICE BASE PEELING SYSTEM

This is a Division of application Ser. No. 08/835,637 filed Apr. 10, 1997 now U.S. Pat. No. 5,759,344, which in turn is a division of application Ser. No. 08/398,179 filed Mar. 2, 1995 now abandoned. The entire discloser of the prior applications are hereby incorporated by reference herein in their entirety.

BACKGROUND OF THE INVENTION

1. Field of the Invention

The present invention relates to a wafer slice base peeling system for peeling a slice base from a wafer which is a silicon and the like to be a substrate of a semiconductor element.

2. Description of the Related Art

A wafer of a silicon and the like to be a substrate is manufactured in a manner that an ingot is sliced by a slicing machine and the like. A slice base is attached to the ingot so as not to break a slicing end while slicing, and then the ingot is sliced together with the slice base. Therefore, the shape of the wafer, which has been sliced, is shown in FIG. 4, and the slice base 10b is peeled off from the substrate portion 10a of the silicon and the like after slicing.

FIGS. 5, 6 and 7 show the essential portions of the conventional wafer slice base peeling system. FIG. 5 is a side view including a partial section of said wafer slice base peeling system, FIG. 6 is a plain view including a partial section of the wafer slice base peeling system and FIG. 7 is a view taken in the direction of the arrows substantially along the line 7—7 in FIG. 5. A wafer 10 is sent in from the left side and sent out to the right side in FIG. 5. Incidentally, FIG. 5 shows a state that the wafer 10 is in the hot-water tank 11 and FIG. 7 shows a state that the wafer 10 is fixed on the clamp base 21 in the peeling part 20.

The wafer slice base peeling system mainly comprises the hot-water tank 11, the peeling part 20, the lifter part 30 and the conveying part 40.

Hot water 12 is stored in the hot-water tank 11 as shown in FIG. 5 and kept at a predetermined temperature by a heater, not shown. Reference numeral 12a is a water surface of the hot water 12. The hot-water tank 11 heats the wafer 10 so as to peel the adhesive of the slice base easily.

The peeling part 20 is arranged at the sending out side of the hot-water tank 11, and comprises the clamp base 21 for receiving the substrate portion 10a of the wafer 10, a clamper 25 for fixing the substrate portion 10a of the wafer 10 by pushing it to the clamp base 21, a guide 23 for guiding the clamper 25 vertically (in FIG. 7, arranged at the back of the guide 26 and provided with the same shape as the guide 26), an air cylinder 24 for driving the clamper 25 vertically in FIG. 5, a pusher 28 for pushing the slice base 10b so as to peel it, a guide 26 for guiding the pusher 28 vertically, an air cylinder 27 for driving the pusher 28 vertically in FIGS. 5, 7, a base 22 for supporting the guide 23, the air cylinder 24, the guide 26 and the air cylinder 27, a basket 29 for storing the slice base 10b which has peeled off, and the like. And, the clamp base 21 is arranged at the upper side of the hot-water tank 11 apart from the water surface 12a of the hot water 12, the clamper 25 is placed just above the clamp base 21, and the pusher 28 is positioned not to interfere with the clamp base 21.

The lifter part 30, as shown in FIGS. 6 and 7, comprises a guide 31 fixed at the left side of the hot-water tank 11, a slider 32 provided so as to be movable vertically along the guide 31, an air cylinder 33 for driving the slider 32 vertically, an arm 34 fixed to the slider 32, lifters 35 fixed to two portions of the arm 34, and the like. As shown in FIG. 7, a groove 35a is formed at the lifter 35 for inserting the periphery of the wafer 10, and with this groove 35a, the wafer 10 is held by the lifter 35. With this arrangement, the lifter 35 moves the wafer 10 from the upper side of the hot-water tank 11 into the hot water 12 and performs as a conveying guide of the wafer 10 at the upper side of the hot-water tank 11.

The conveying part 40, as shown in FIGS. 6 and 7, comprises a horizontal guide 41 fixed to the right side of the hot-water tank 11, a horizontal slider 42 provided so as to be movable horizontally along the horizontal guide 41, a feed screw 43 for driving a feed nut built in the slider 42, a pulley 44 for transmitting the rotation of a motor (not shown) to the feed screw 43, a vertical guide 45 fixed to the horizontal slider 42, a vertical slider 46 provided so as to be movable vertically along the vertical guide 45, an air cylinder 47 for driving the vertical slider 46 vertically, an arm 48 fixed to the vertical slider 46, a conveying head 49 which abuts against the edge of the wafer 10, and the like. With this arrangement, the conveying part 40 is driven, whereby the conveying head 49 abuts against the wafer 10 and the wafer 10 is conveyed from the hot-water tank 11 to the peeling part, further to the next step. As described above, the lifter 35 guides the wafer 10 while conveying. And, when the wafer is sent from the previous step, as shown by a two-dot chain line in FIG. 5, the conveying head 49 moves upward so as not to interfere with the wafer 10.

Next, an explanation will be given of the method for peeling the slice base 10b from the wafer 10 with the wafer slice base peeling system as described above. As shown with the two-dot chain line in FIG. 5, when the lifter 35 and the conveying head 49 rise to the limits, the wafer 10 is sent into the groove 35a of the lifter 35 which is arranged at the upper side of the hot-water tank 11 from the previous step by the conveying system of the previous step. When the wafer 10 is sent in, the lifter 35 goes down to move the wafer 10 into the hot water 12. When the wafer 10 reaches at the predetermined temperature in the hot water 12, the lifter 35 rises so as to return the wafer 10 to the position for sending in. Next, the conveying head 49 goes down and moves to the sending out side, whereby the wafer 10 is conveyed to the peeling part 20. In the peeling part 20, the clamper 25 pushes the substrate portion 10a to the clamp base 21 fixedly, and then the pusher 28 pushes the slice base 10b so as to peel off the slice base 10b. After peeling, the clamper 25 and the pusher 28 rise, and then the conveying head 49 moves to the sending out side again and sends out the wafer 10 to the next step. And, the slice base 10b, which has been peeled off, falls and is stored in the basket 29.

However, in the conventional method, though the slice base 10b is easily peeled off with the hot water 12, the peeling step is performed in the atmosphere in which the temperature is lower than that of the hot water 12, therefore, the temperature of the adhesive for the slice base 10b becomes lower since the air is contact with the clamp base 21, the clamper 25 and the like. As a result, the adhesive re-hardens so that the slice base 10b becomes hard to peel off, therefore, there is a problem in that the wafer 10 can easily break while it is being peeled off.

SUMMARY OF THE INVENTION

The present invention has been developed to eliminate the above-described problems and has as its aim the provision of a wafer slice base peeling system wherein there is no possibility that the wafer 10 will be broken while the slice base 10b is peeled off from the wafer 10.

To achieve the above-described object, a wafer slice base peeling system comprising: a fixing member for fixing a substrate portion of a wafer; a heater for heating at least an adhesive portion between said substrate portion of said wafer, which is fixed by said fixing member, and a slice base; and, a pushing member for pushing a slice base of said wafer, of which said substrate portion is fixed by said fitting member, and for peeling said slice base from said substrate portion.

To achieve the above-described object, a wafer slice base peeling system comprising: a how water tank with hot water stored therein; a lifter member for holding a wafer, and for moving said wafer from an upper side of said hot water tank into said hot water tank so as to dip it in said hot water; a fixing member for fixing a substrate portion of said wafer dipped in said hot water of said hot water tank; and, a pushing member for pushing a slice base of said wafer, of which said substrate portion is fixed by said fitting member, and for peeling said slice base from said substrate portion.

And, to achieve the above-described object, a wafer slice base peeling system comprising: a clamp base for receiving a substrate portion of a wafer; a heater built in said clamp base for generating heat and heating said wafer; a clamper for fixing said substrate portion to said clamp base; and, a pusher arranged near said clamper at a side of a slice base, which is adhered to said substrate portion of said wafer, for pushing said slice base.

Further, to achieve the above-described object, a wafer slice base peeling system comprising: a clamp base for receiving a substrate portion of a wafer; a clamper for fixing said substrate portion to said clamp base; a pusher arranged near said clamper at a side of a slice base, which is adhered to said substrate portion of said wafer, for pushing said slice base; a nozzle placed between said clamper and said pusher and provided with a blow-off opening to a boundary portion between said substrate portion and said slice base; and, hot air generating means connected with said nozzle for generating hot air at a predetermined temperature.

Moreover, to achieve the above-described object, a wafer slice base peeling system comprising: a clamp base for receiving a substrate portion of a wafer; a clamper for fixing said substrate portion to said clamp base; a pusher arranged near said clamper for pushing a slice base adhered to said substrate portion of said wafer; a slice base provided at a side of said slice base near said clamp base opposite to said pusher so as to be oscillatable in a direction of a thickness of said wafer; and, a heater built in said slice base receiving plate for generating heat at a predetermined temperature and heating said wafer; wherein an upper surface of said slice base receiving plate corresponds to an upper surface of said clamp base while heating said wafer with said heater, and said slice base receiving plate is apart from said slice base while peeling said slice base.

According to the present invention, the substrate portion of the wafer is fixed by the fixing member, and then at least the adhesive portion between the substrate porion of the wafer and the slice base is heated by the heater. When the adhesive between the substrate portion and slice base is softened, the slice base is pushed by the pushing member, whereby the slice base is peeled off from the substrate portion.

According to the present invention, the wafer is dipped in the hot water by the lifter member, and the substrate portion of the wafer is fixed by the fixing member. When the wafer reaches at the predetermined temperature in the hot water, the pushing member starts to push the slice base whereby the slice base is peeled off from the substrate portion. In this invention, the peeling step is performed in the hot water tank, therefore, the temperature of the wafer is not lowered and the adhesive can be peeled off easily, so that the wafer can be kept from breaking while peeling.

According to the present invention, the clamper pushes and fixes the substrate portion to the clamp base which is heated and kept at the predetermined temperature by the built-in heater. When the substrate portion is contact with the heated clamp base for a predetermined time, the adhesive for bonding the substrate portion and the slice base is softened, and the pusher pushes the slice base so as to peel the slice base from the entire substrate portion.

In this case, the clamp base is formed only in the vicinity of the slice base, however, the clamp base may be formed to cover the substrate portion.

According to the present invention, the clamper pushes and fixes the substrate portion to the clamp base, and the hot air at the predetermined temperature is blown from the blow-off opening of the nozzle connected with the hot air generating means so as to heat the boundary portion between the substrate portion and the slice base. After being heated for a predetermined time, the adhesive for bonding the substrate portion and the slice base softens, so that the pusher pushes the slice base and peels the slice base from the substrate portion.

And, according to the present invention, when the upper surface of the slice base receiving plate and that of the clamp base are in the same surface, the clamper pushes and fixes the substrate portion to the clamp base, and then the pusher pushes the slice base to the slice base receiving plate. The slice base receiving plate is heated and kept at the predetermined temperature by the built-in heater, and when the slice base is contact with the heated slice base receiving plate for the predetermined time, the adhesive for bonding the substrate portion and the slice base becomes soft. The slice base receiving plate contacts with the slice base for the predetermined time, and then the slice base receiving plate moves apart from the slice base and the pusher pushes the slice base so as to peel the slice base from the substrate portion.

In all these inventions, the peeling is performed while heating the wafer, so that the temperature of the wafer does not lower during the peeling and the adhesive for bonding the substrate portion and the slice base can be peeled off easily. Therefore, the wafer is kept from breaking while peeling.

BRIEF DESCRIPTION OF THE DRAWINGS

The exact nature of this invention, as well as other aims and advantages thereof, will be readily apparent from consideration of the following specification relating to the accompanied drawings, in which like reference characters designate the same or similar parts throughout the figures thereof and wherein.

DESCRIPTION OF THE PREFERRED EMBODIMENT

A detailed description will hereafter be given of the preferred embodiment of a wafer slice base peeling system according to the present invention with reference to the accompanying drawings.

Figure 1:
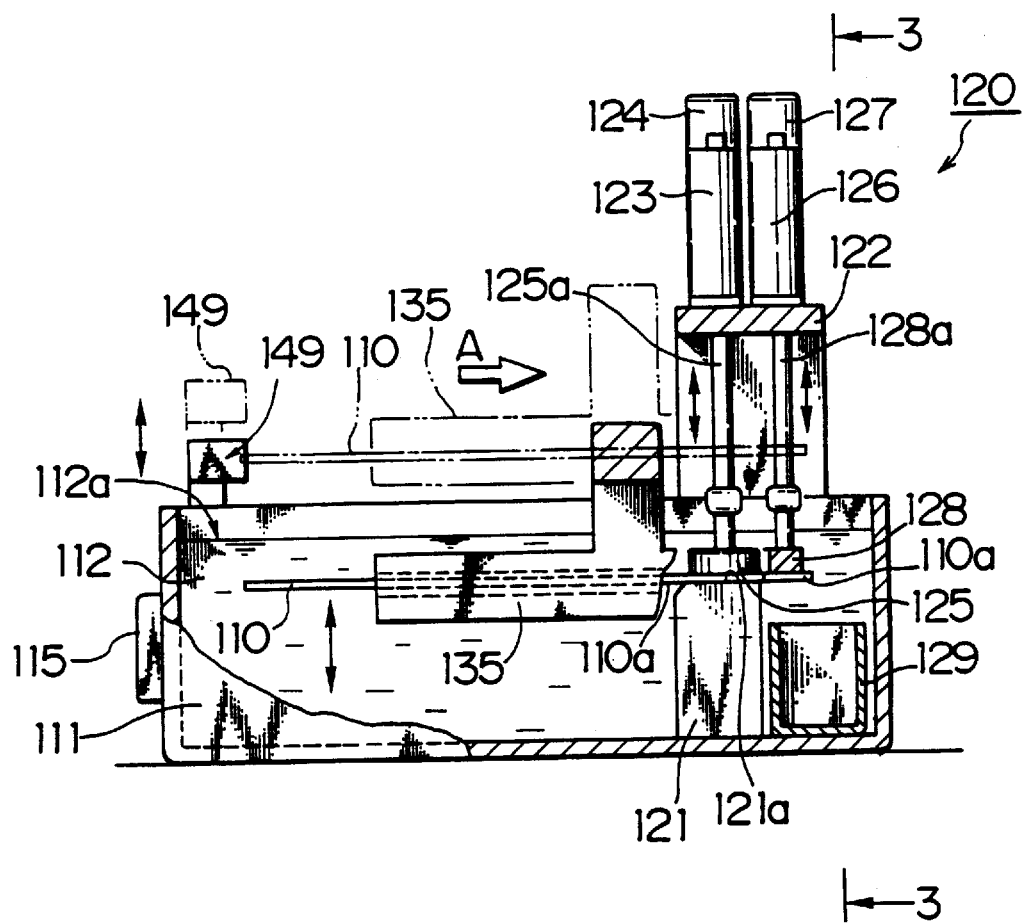
FIG. 1 is a side view including a partial section of a wafer slice base peeling system according to the present invention.
Figure 2:
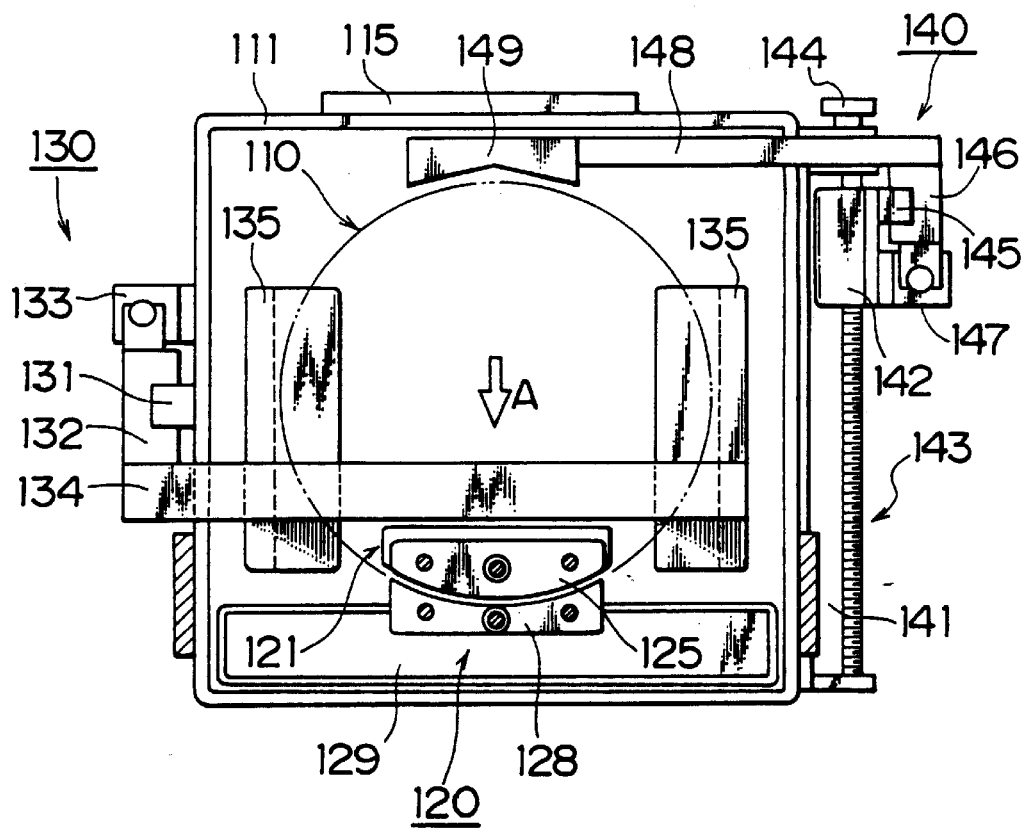
FIG. 2 is a plain view including a partial section of the wafer slice base peeling system shown in FIG. 1.
Figure 3:
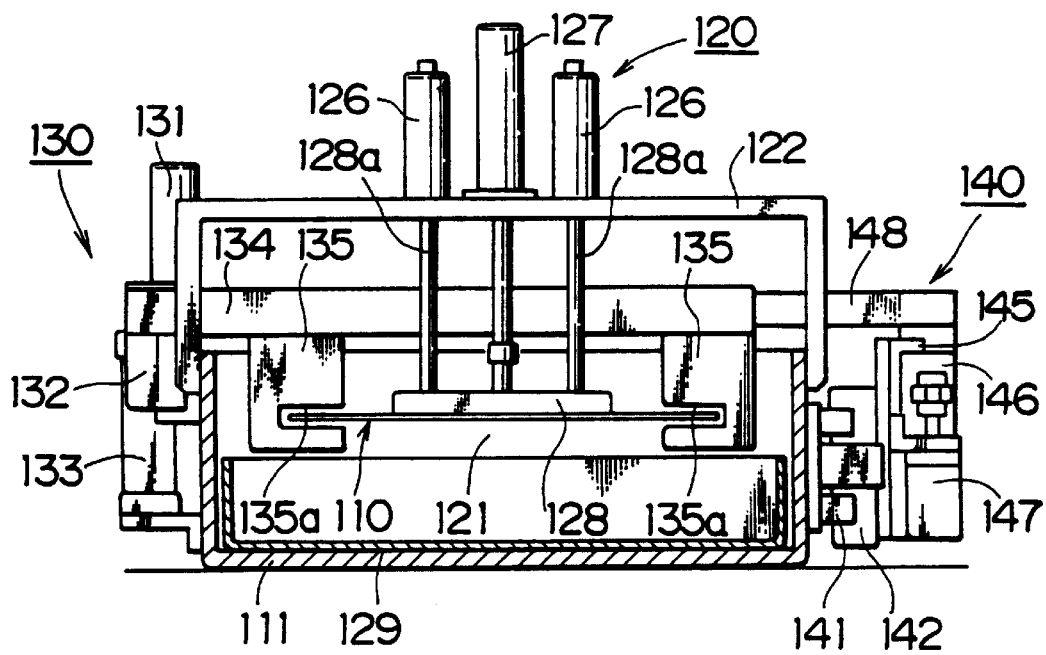
FIG. 3 is a view taken in the direction of the arrows substantially along the line 3—3 in FIG. 1.
Figure 4:
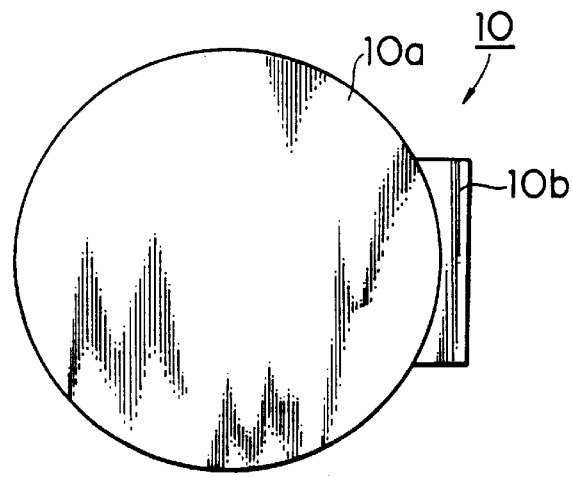
FIG. 4 is a view showing an apparent shape of the wafer.
Figure 5:
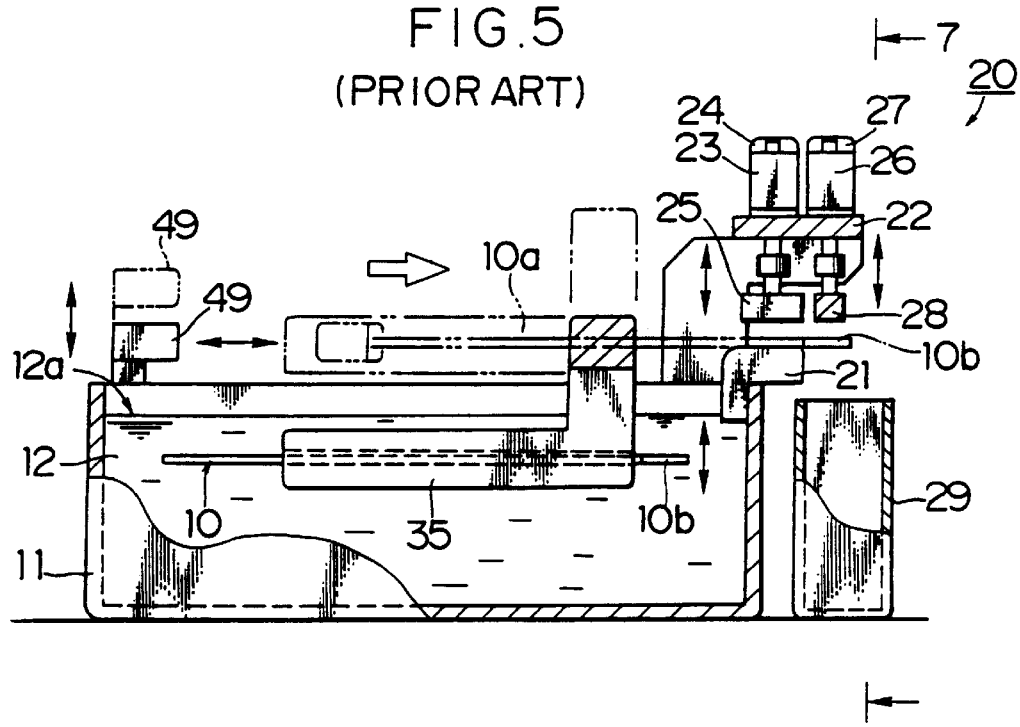
FIG. 5 is a side view including a partial section of the conventional wafer slice base peeling system and showing a state that a wafer is in a hot-water tank.
Figure 6:
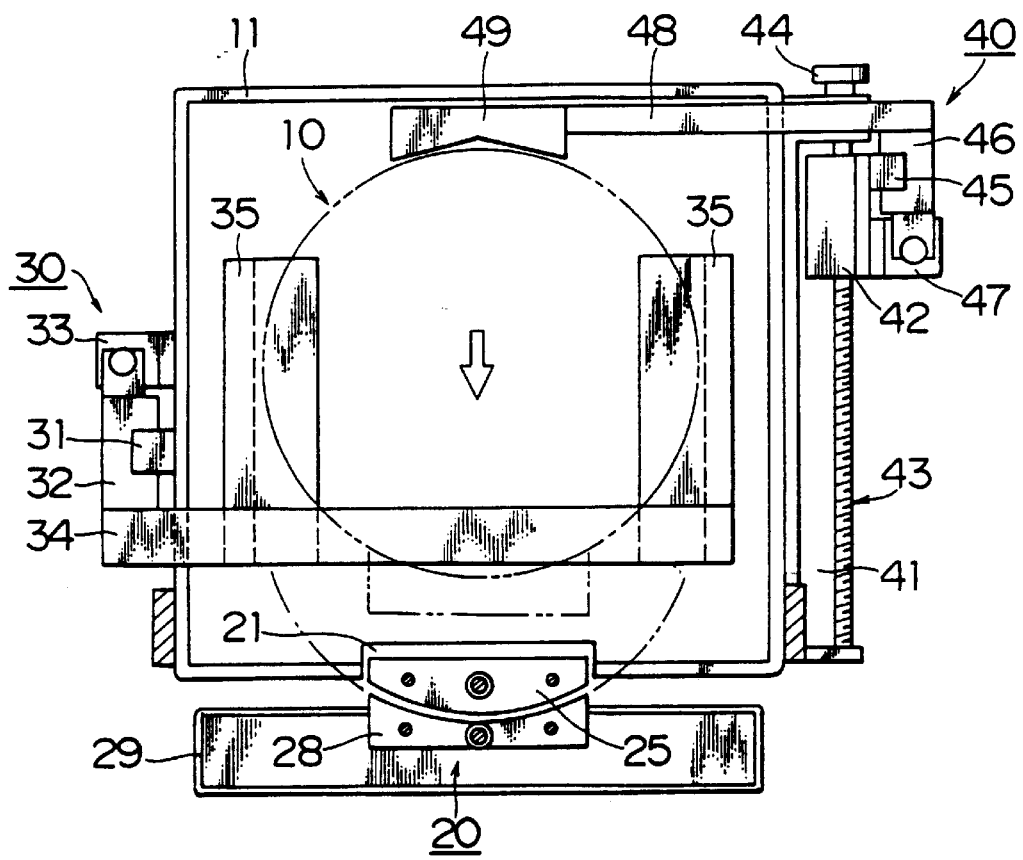
FIG. 6 is a plain view including a partial section of the wafer slice base peeling system shown in FIG. 5.
Figure 7:
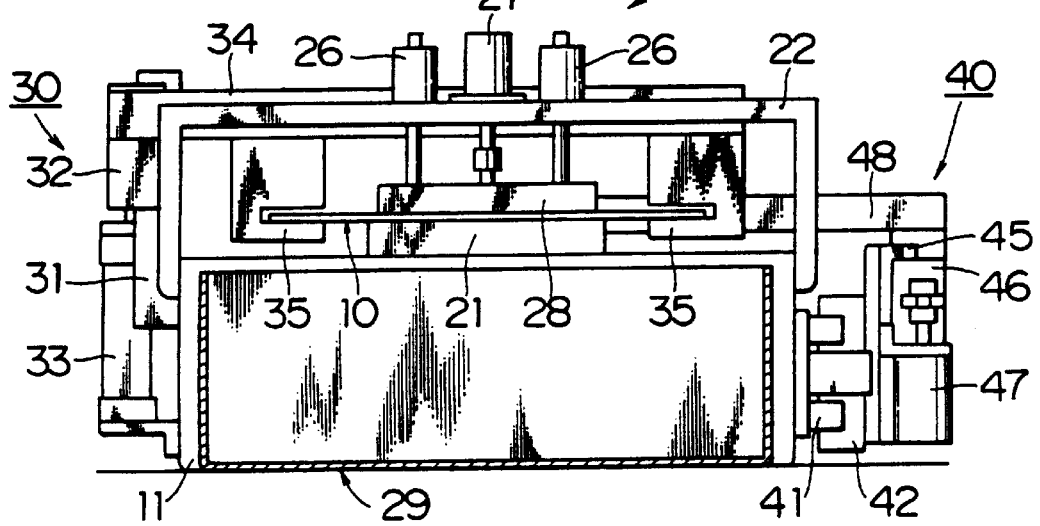
FIG. 7 is a view taken in the direction of the arrows substantially along the line 7—7 in FIG. 5 and showing a state that a wafer is fixed on a clamp base in a peeling part.

FIGS. 1, 2 and 3 show essential portions in the embodiment of the wafer slice base peeling system according to the present invention. FIG. 1 is a side view including a partial section of said wafer slice base peeling system, FIG. 2 is a plain view including a partial section of the wafer slice base peeling system shown in FIG. 1 and FIG. 3 is a view taken in the direction of the arrows substantially along the line 3—3 in FIG. 1, and FIGS. 1, 2 and 3 show a state that a wafer 110 is fixed on a clamp base 121. And, the wafer 110 is sent in from the left side and out to the right side.

The wafer slice base peeling system according to the present invention comprises a hot-water tank 110, a peeling part 120, a lifter part 130 and a conveying part 140.

Hot water 112 is stored in the hot-water tank 111 and is kept at a predetermined temperature, in which an adhesive for a slice base 110b softens, by a heater 115 provided in the hot-water tank 111. Reference numeral 112a is a water surface of the hot water 112.

The present invention is characterized by the position of the peeling part 120 and there are differences between this embodiment and the conventional one. The peeling part 120 is arranged in the hot-water tank 111, a clamp base 121 for receiving a substrate portion 110a of the wafer 110 is placed in the hot water 112 and the upper surface of the clamp base 121 is positioned below the water surface 112a of the hot water 112. At the upper side of the clamp base 121, there are a clamper 125 for pushing and fixing the substrate portion 110a of the wafer 110 to the clamp base 121, a guide 123 for guiding the clamper 125 vertically through an axis 125a (arranged at the back of a guide 126 and having the same shape as the guide 26), an air cylinder 124 for driving the clamper 125 vertically, a pusher 128 for pushing and peeling the slice base 110b, a guide 126 for guiding the pusher 128 vertically through an axis 128a, an air cylinder 127 for driving the pusher 128 vertically, a base 122 for supporting the guide 123, the air cylinder 124, the guide 126 and the air cylinder 127, a basket for storing the slice base 110b which has peeled off, and the like. In this case, the clamper 125 is positioned just above the clamp base 112, and the pusher 128 is arranged so as not to interfere with the clamp base 121. And, the basket 129 is placed in the hot-water tank 111.

The lifter part 130, as shown in FIGS. 2 and 3 comprises a guide 131 fixed to the left side of the hot-water tank 111, a slider 132 provided so as to be movable vertically along the guide 131, an air cylinder 133 for driving the slider 132 vertically, an arm 134 fixed to the slider 132, lifters 135 fixed to two portions of the arm 134, and the like. As shown in FIG. 3, a groove 135a is formed at the lifter 135 for inserting the periphery of the wafer 110, and with this groove 135a, the wafer 110 is held by the lifter 135. With this arrangement, the lifter 135 moves the wafer 110 from the upper side of the hot-water tank 111 into the hot water 112 and performs as a conveying guide of the wafer 110 at the upper side of the hot-water tank 111.

The conveying part 140 merely conveys the wafer 110 from the upper position of the hot-water tank 111 to the next step. The conveying part 140, as shown in FIGS. 2 and 3, comprises a horizontal guide 141 fixed to the right side of the hot-water tank 111, a horizontal slider 142 provided so as to be movable horizontally along the horizontal guide 141, a feed screw 143 for driving a feed nut built in the horizontal slider 142, a pulley 144 for transmitting the rotation of a motor (not shown) to the feed screw 143, a vertical slider 145 fixed to the horizontal slider 142, a vertical slider 146 provided so as to be movable vertically along the vertical guide 145, an air cylinder 147 for driving the vertical slider 146 vertically, an arm 148 fixed to the vertical slider 146, a conveying head 149 fixed to the arm 148 for abutting against the edge of the wafer 110, and the like. The conveying head 149 abuts against the wafer 110 by driving the conveying part 140, and conveys the wafer 110 from the upper position of the hot-water tank 111 to the next step. And, when the wafer 110 is sent from the previous step, the conveying head 148 moves upward so as not to interfere with the wafer 110, as shown with the two-dot chain line in FIG. 1.

Next, an explanation will be given of the method of peeling the slice base 110b from the wafer 110 in the wafer slice base peeling system structured as described above. When the lifter 135 and the conveying head 149 rise to the limits, the wafer 110 is conveyed into the groove 135a of the lifter 135, which is positioned at the upper of the hot-water tank 111, from the previous step with the conveying system in the previous step. When the wafer 110 is sent in, the lifer 135 goes down so as to move the wafer 110 into the hot water 112 and the clamper 125 pushes the substrate portion 110a to the clamp base 121 fixedly. When the wafer 110 reaches to the predetermined temperature, the pusher 128 goes down and pushes the slice base 110b so as peel the slice base 110b. After peeling, the clamper 125 and the pusher 128 rise, and then the lifter 135 goes up so as to return the wafer 110 to the position for sending in. Next, the conveying head 149 goes down and moves to the sending out side, shown by an arrow A, and the wafer 110 is conveyed to the next step. And, the slice base 110*b*, which has been peeled, falls and is stored in the basket 129.

Further, in the conveying part 140, an air cylinder or the like may be used for driving horizontally in addition to this embodiment. And, in the wafer slice base peeling system according to the present invention, since the wafer 110 is conveyed only from the upper position of the hot-water tank 111 to the next step, any method of conveying may be acceptable, therefore, a conveying system for common use of the previous step may be used, or the wafer 110 may be sent in and out from the lifter 135 manually.

As described above, according to the wafer slice base peeling system of the present invention, the wafer 110 moves into the hot water 112 by the lifter 135, and the clamper 125 pushes the substrate portion 110*a* to the clamp base 121 fixedly. When the wafer 110 reaches at the predetermined temperature in the hot water 112, the pusher 128 goes down and pushes the slice base 110*b*, whereby the slice base 110*b* is peeled. The peeling is performed in the hot water 112, therefore, the temperature of the wafer 110 is not lowered so that the adhesive can be peeled easily.

Therefore, in the wafer slice base peeling system according to the present invention, the wafer 100 can be kept from breaking while peeling.

And, the wafer 100 is conveyed only from the upper position of the hot-water tank 111 to the next step, so that a conveyance system can be manufactured at a lower cost.

Figure 8:
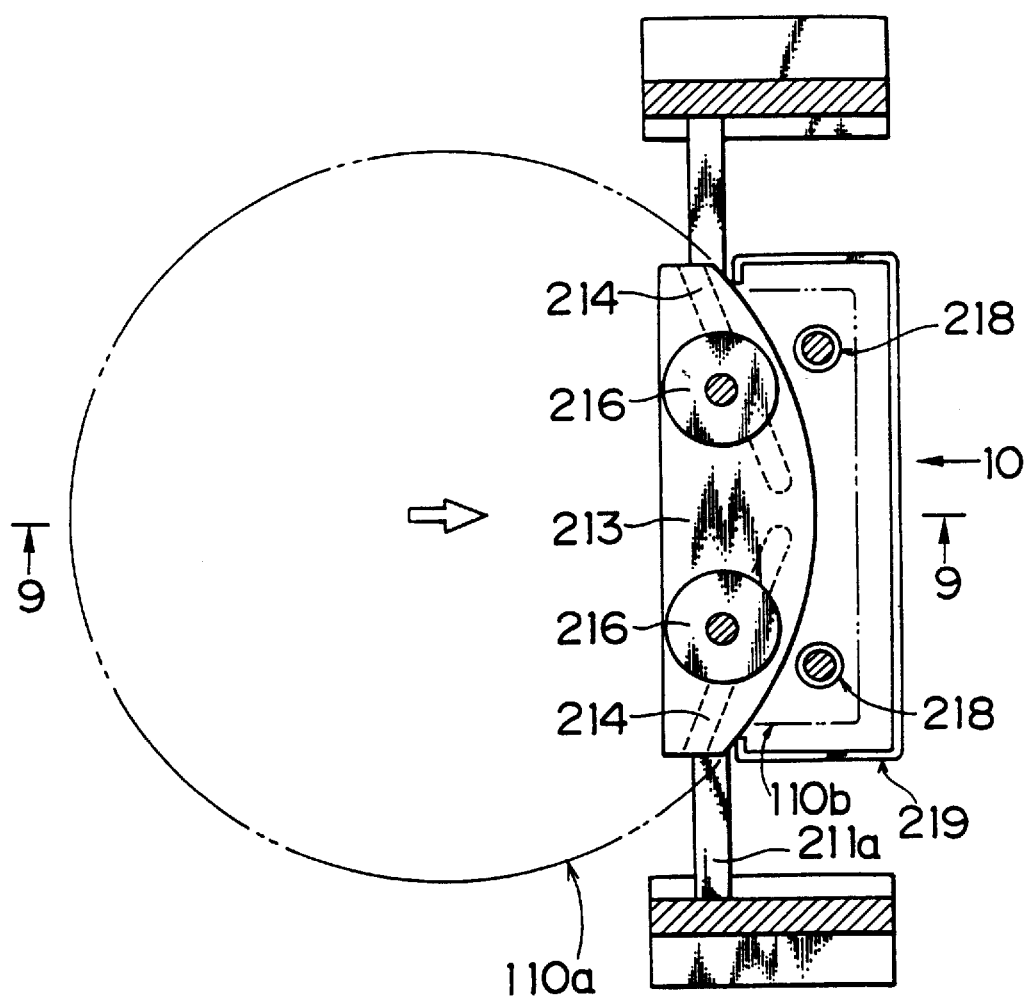
FIG. 8 is a plain view showing an essential portion of the second embodiment of the wafer slice base peeling system according to the present invention.
Figure 9:
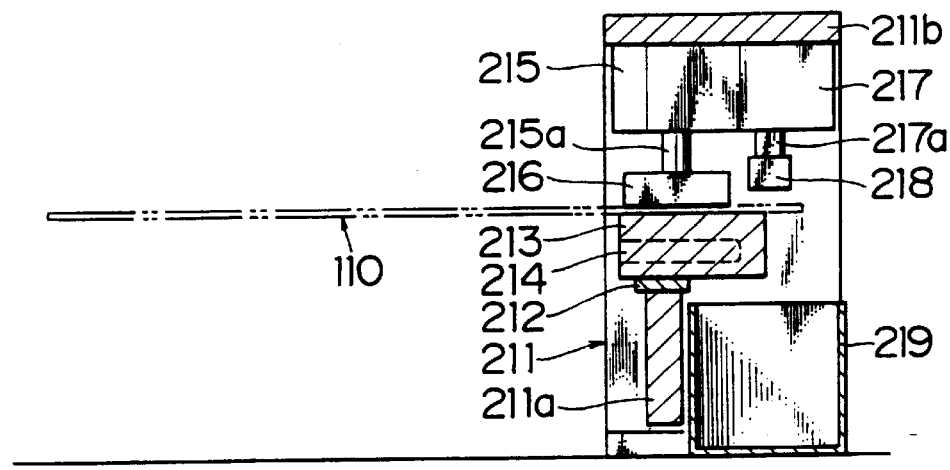
FIG. 9 is a sectional view taken on the line 9—9 in FIG. 8.
Figure 10:
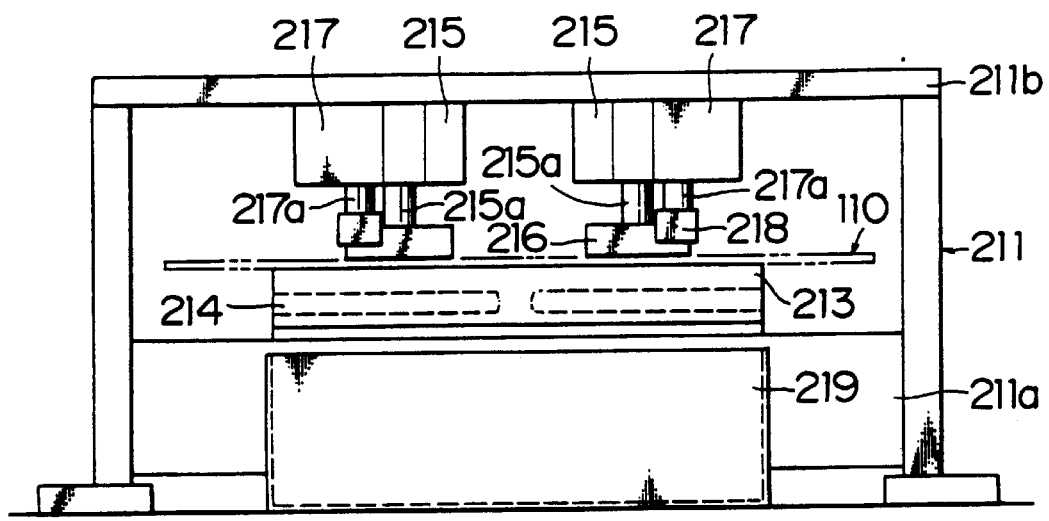
FIG. 10 is a view taken from an arrow 10 in FIG. 8.

FIGS. 8, 9 and 10 show the essential portions of the second embodiment of the wafer slice base peeling system according to the present invention. FIG. 8 is a plain view (the upper part is a partially sectional view), FIG. 9 is a sectional view taken on the line 9—9 in FIG. 8, and FIG. 10 is a view taken from an arrow 10 in FIG. 8; a wafer 110 is sent in from the left side and sent out to the right side in FIG. 8. FIGS. 8, 9, 10 show a state in that the wafer 110 is fixed before peeling off from a slice base 110*b*.

In FIGS. 8, 9 and 10, a clamp base 213 is fixed to an upper surface of a lower plate 211*a* of a portal base 211 through a heat insulating plate 211, and a heater 211 for generating heat at a predetermined temperature is built in the clamp base 213. The clamp base 213 at the side of the slice base 110*b* has the same shape as the substrate portion 110*a* (an arc), the width thereof is slightly larger than that of the slice base 110*b*. And, two air cylinders 215*b*, 215*b* are attached to the lower surface of the upper plate 211*b* at the upper side of the clamp base 213, and each a clamper 216 is attached to a piston 215*a* of the air cylinder 215. Further, two air cylinders 217, 217 are fixed to the lower surface of the upper plate 211*b* at the side of the slice base 110*b* in the vicinity of the air cylinder 215, and a pusher 218 is attached to the piston 217*a* of each air cylinder 217. A basket is placed at the lower side of the clamp base 213.

Next, an explanation will be given of the operation in that the slice base 110*b* is peeled off from the substrate portion. 110*a* with the wafer slice base peeling system as described above.

When the wafer 110, which has been washed after slicing, is sent into the predetermined position of the clamp base 213 with conveying means not shown, the clamper lowers, pushes and fixes the substrate portion 110*a* to the clamp base 213. The clamper 216 fixes the substrate portion 110*a* to the clamp base 213 and the predetermined time passes, and then the pusher 218 pushes slice base 110*b* so as to peel the slice base 110*b* from the substrate portion 110*a*. The slice base 110*b*, which has been peeled off, falls and is stored in the basket 219.

In this case, a heater 214 is built in the clamp base for keeping a predetermined temperature (about 100° C.), and when the substrate portion 110*a* is contact with the clamp base 213 for a predetermined time, the adhesive for bonding the substrate portion 110*a* with the slice base 110*b* becomes high temperature and softens, so that it can be peeled off easily.

Further, in this case, the clamp base 213 may be arranged only in the vicinity of the slice base 110*b*, or, the clamp base 213 may be shaped for including the entire substrate portion 110*a* so as to heat the entire substrate portion 110*a*.

Figure 11:
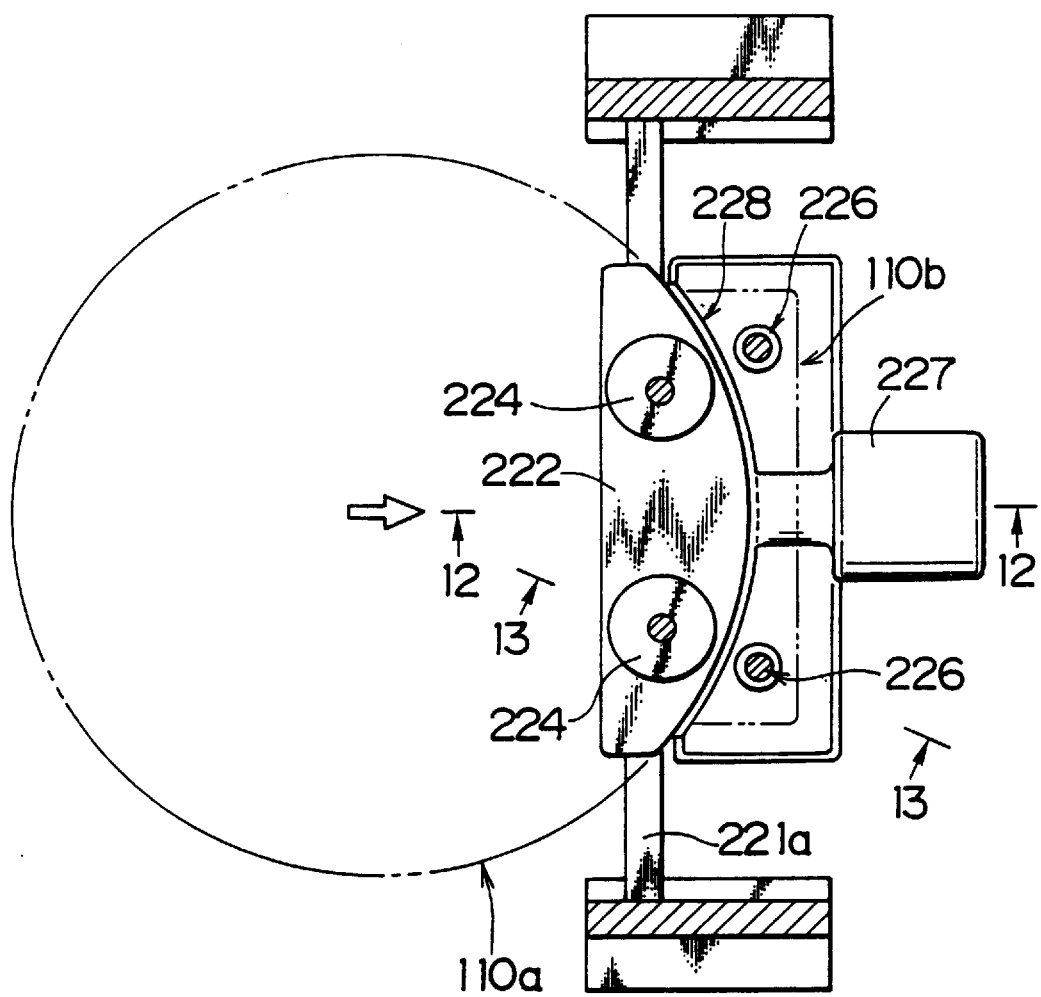
FIG. 11 a plain view showing an essential portion of the third embodiment of the wafer slice base peeling system according to the present invention.
Figure 12:
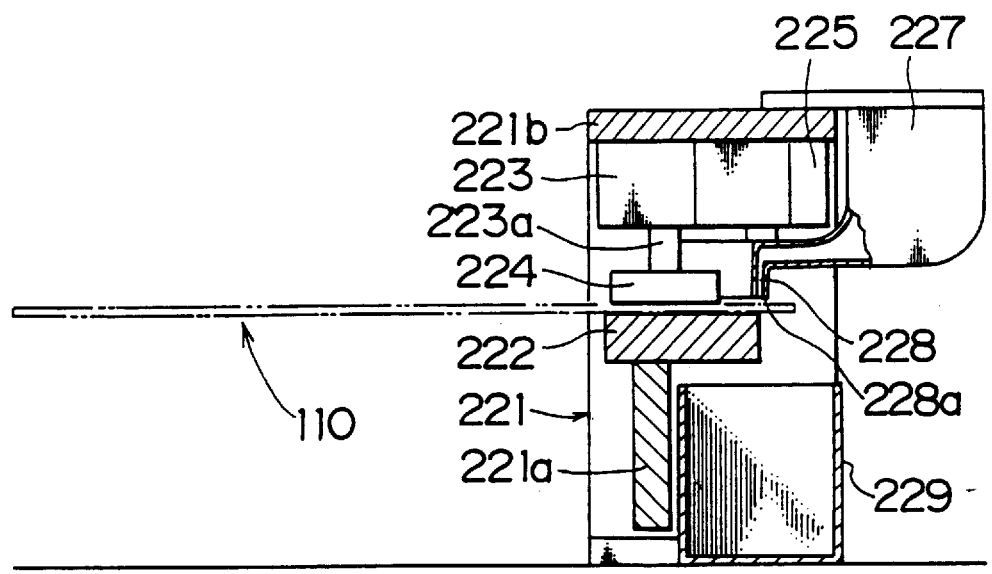
FIG. 12 is a sectional view taken on the line 12—12 in FIG. 11.
Figure 13:
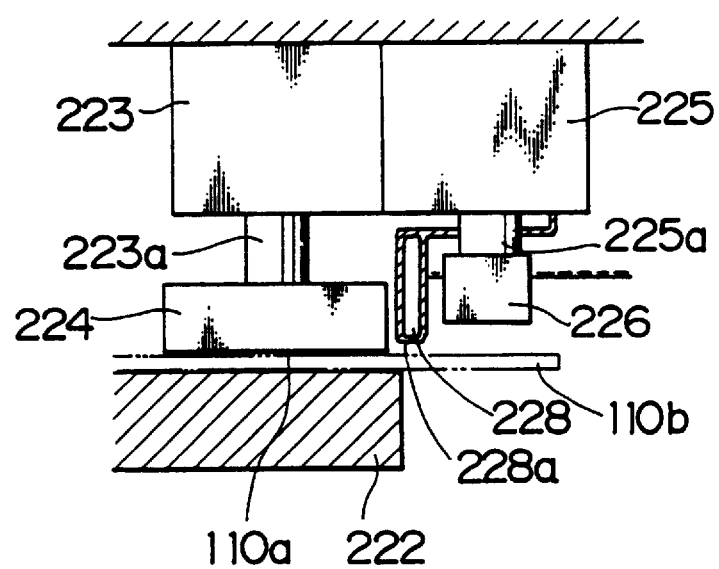
FIG. 13 is a sectional view taken on the line 13—13 in FIG. 11.

FIGS. 11, 12 and 13 show the essential portions of the third embodiment of the wafer slice base peeling system according to the present invention. FIG. 11 is a plain view (the upper part is a partially sectional view), FIG. 12 is a sectional view taken on the line 12—12 in FIG. 11, and FIG. 13 is a sectional view taken on the line 13—13 in FIG. 11 (partially detailed view); a wafer 110 is sent in from the left side and sent out to the right side in FIG. 11. FIGS. 11, 12 and 13 show a state in that the wafer 110 is fixed before peeling off from a slice base 110*b*.

In FIGS. 11, 12 and 13, a clamp base 222 is fixed to an upper surface of a lower plate 211*a* of a portal base 211. The clamp base 222 at the side of the slice base 110*b* has the same shape as the substrate portion 110*a* (an arc), the width thereof is slightly larger than that of the slice base 110*b*. And, two air cylinders 223 and 223 are attached to the lower surface of the upper plate 211*b* at the upper side of the clamp base 222, and a clamper 224 is attached to each piston 223*a* of the air cylinder 223. Further, two air cylinders 225, 225 are fixed to the lower surface of the upper plate 221*b* at the side of the slice base 110*b* in the vicinity of the air cylinder 225, and a pusher 226 is attached to each piston 225*a* of the air cylinder 225. Further, a nozzle 228 is provided between the clamper 224 and the pusher 226, and a blow-off opening 228*a* of the nozzle 228 is formed in the substantial same shape as the boundary shape (an arc) between the substrate portion 110*a* and the slice base 110*b*. And, hot air generating means 227 for generating hot air at a predetermined temperature is connected with the nozzle 228. A basket 229 is placed at the lower side of the clamp base 222.

Next, an explanation will be given of the operation in that the slice base 110*b* is peeled off from the substrate portion 110*a* with the wafer slice base peeling system as described above.

When the wafer 110, which has been washed after slicing, is sent into the predetermined position of the clamp base 222 with conveying means not shown, the clamper 224 lowers, and pushes and fixes the substrate portion 110*a* to the clamp base 222. Next, hot air at a predetermined temperature is sent out from the blow-off opening 228*a* of the nozzle 228 which is connected with the hot air generating means 227, and the boundary portion between the substrate portion 110*a* and the slice base 110*b* is heated. When the predetermined time passes in this state, the pusher 226 pushes slice base 110*b* so as to peel the slice base 110*b* from the substrate portion 110*a*. The slice base 110*b*, which has peeled off, falls and is stored in the basket 219.

In this case, the hot air, which is sent out from the hot air generating means 227 through the nozzle 228, is heated and kept at a predetermined temperature (about 100° C.), and when the hot air is sent for a predetermined time, the adhesive for bonding the. substrate portion 110*a* with the slice base 110b becomes high temperature and softens, so that it can be peeled off easily.

Figure 14:
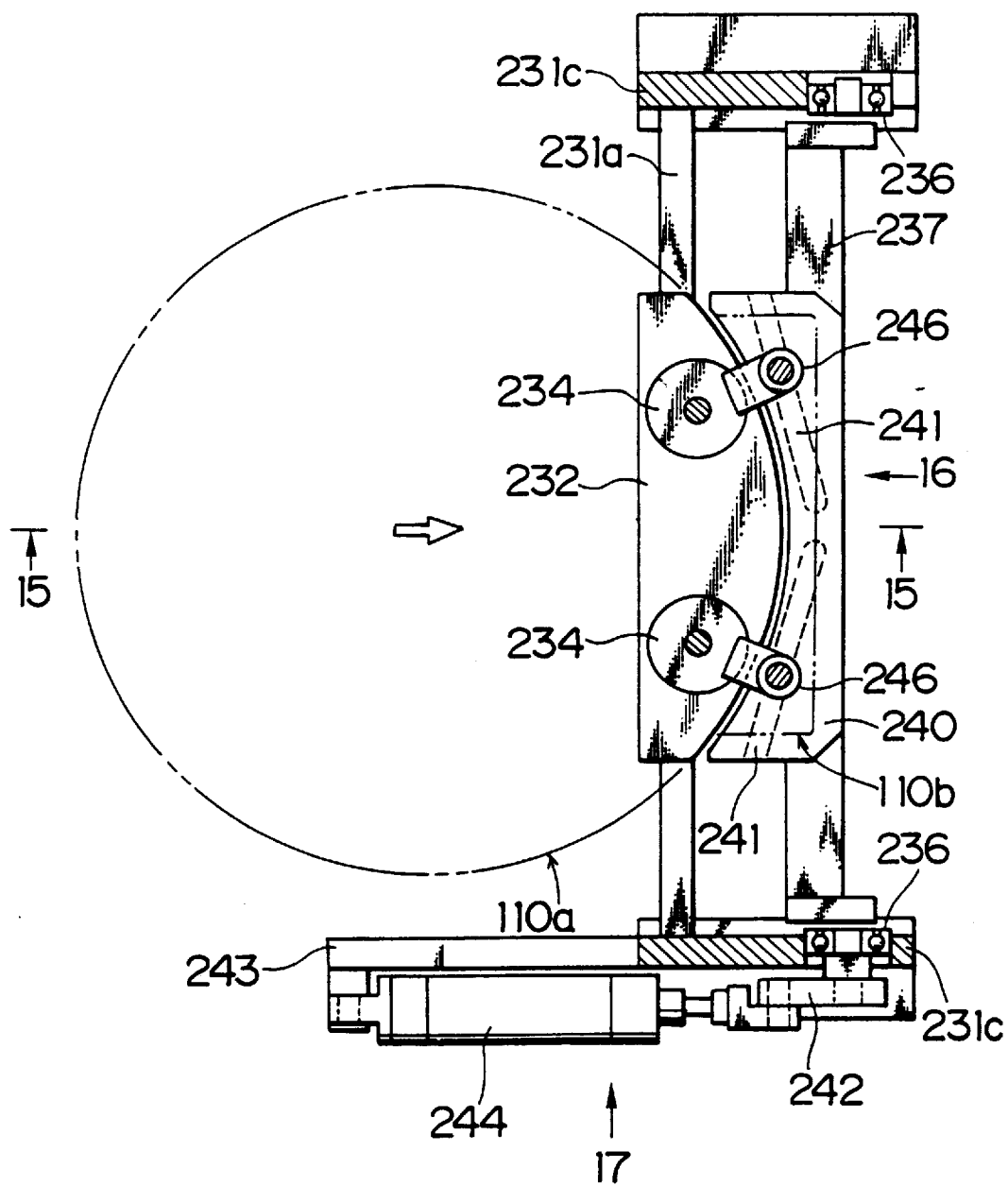
FIG. 14 a plain view showing an essential portion of the fourth embodiment of the wafer slice base peeling system according to the present invention.
Figure 15:
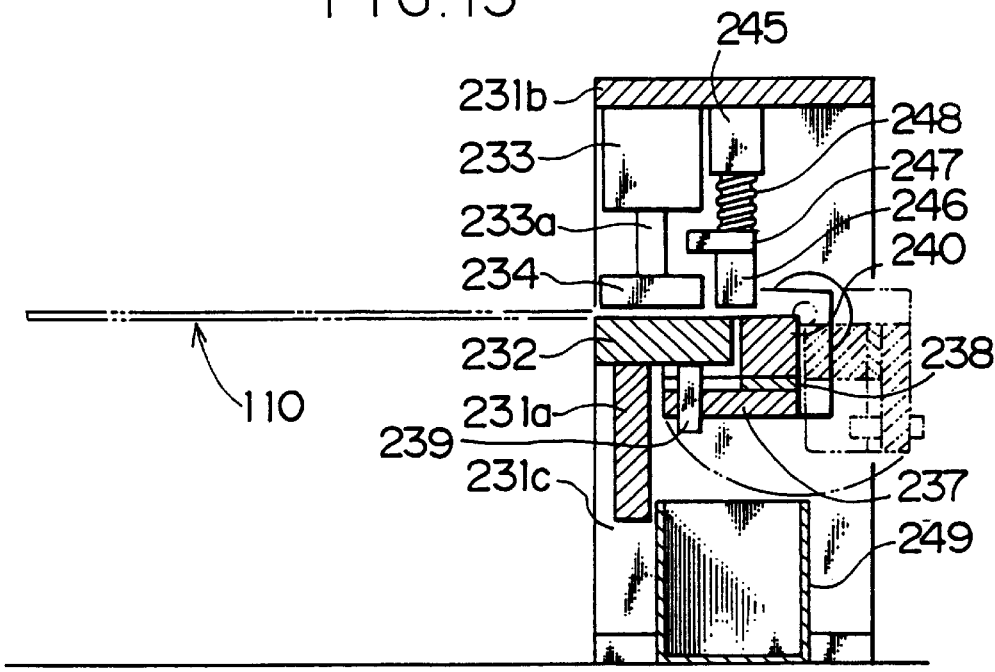
FIG. 15 is a sectional view taken on the line 15—15 in FIG. 14.
Figure 16:
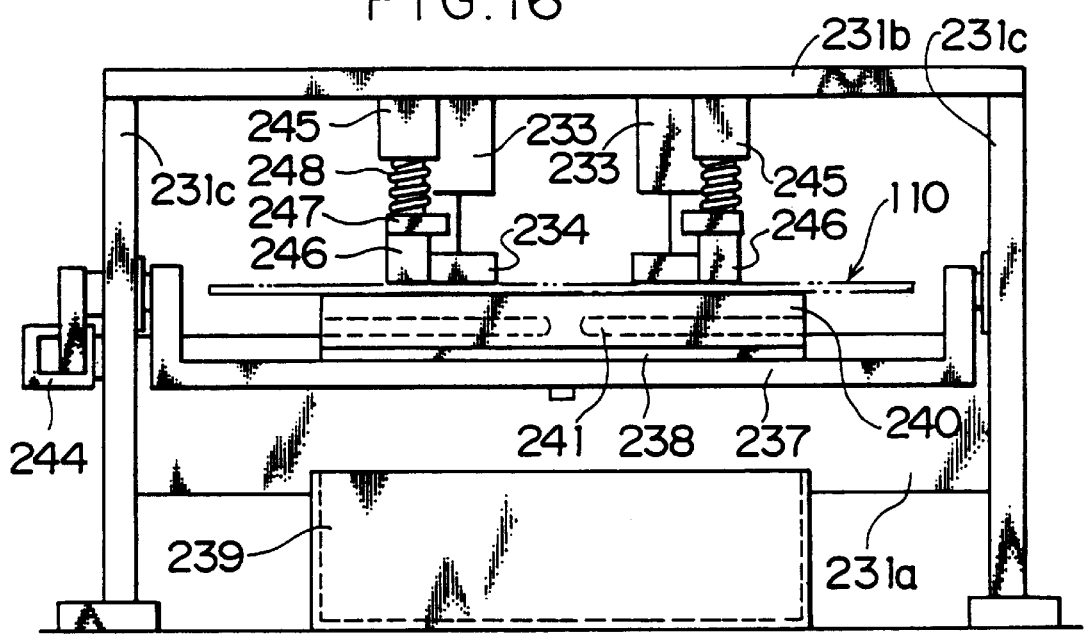
FIG. 16 is a view taken from an arrow 16 in FIG. 14.
Figure 17:
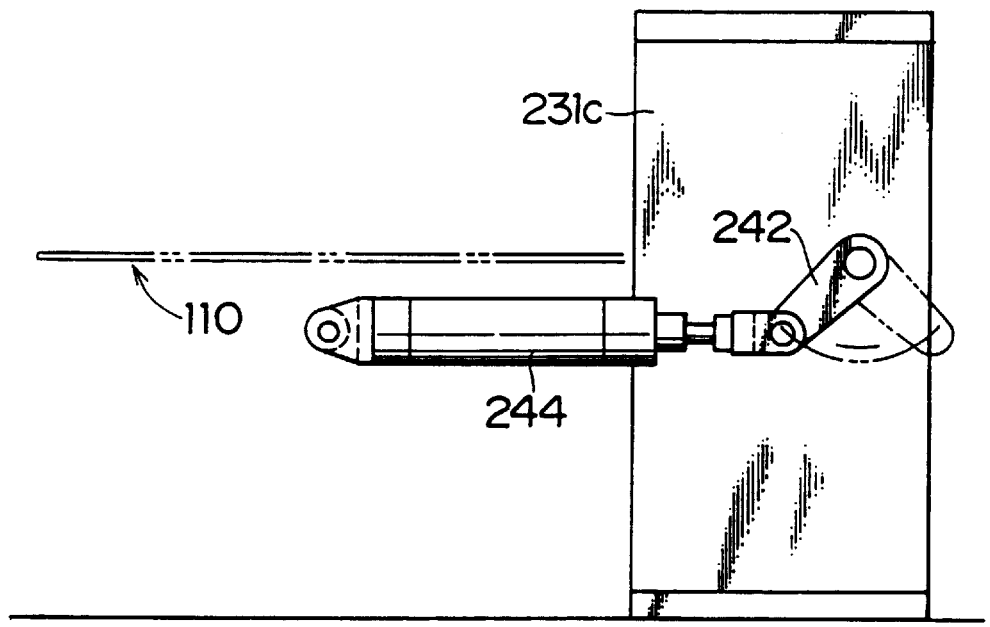
FIG. 17 is a view taken from an arrow 17 in FIG. 14.

FIGS. 14, 15, 16 and 17 show the essential portions of the forth embodiment of the wafer slice base peeling system according to the present invention. FIG. 14 is a plan view (the upper part is a partially sectional view), FIG. 15 is a sectional view taken on the line 15—15 in FIG. 14, FIG. 16 is a view taken from an arrow 16 in FIG. 14, and FIG. 17 is a view taken from an arrow 17 in FIG. 14; a wafer 110 is sent in from the upper side and sent out to the lower side in FIG. 14. FIGS. 14, 15, 16 and 17 show a state in that the wafer 110 is fixed before peeling off from a slice base 110b.

In FIGS. 14, 15, 16 and 17, a clamp base 232 is fixed to an upper surface of a lower plate 231a of a portal base 231. The clamp base 232 at the side of the slice base 110b has the same shape as the substrate portion 110a (an arc), the width thereof is slightly larger than that of the slice base 110b. And, two air cylinders 233 and 233 are attached to the lower surface of the upper plate 231b at the upper side of the clamp base 232, and each piston 233a of the air cylinder 233 is attached with a clamper 234.

Further, bearings 236 and 236 are arranged at longitudinal plates 231c, 231c at both sides of the base 231, and a bracket 237 is supported by the bearings 236, 236 so as to be oscillatable. An arm 242 is fixed to the oscillating axis of the bracket 237 and is oscillated about 90° by the air cylinder 244 which is supported by a holder 243. A slice base receiving plate 240 is fixed to the bracket 237 through the heat insulating plate 238, and the upper surface of the slice base receiving plate 240 (the contact surface of the slice base 110b) can oscillate only to the same surface as the upper surface of the clamp base 232 (the contact surface of the substrate portion 110a) by a stopper 239 provided at the bracket 237. A heater 241 is built in the slice base receiving plate 240 for heating to a predetermined temperature. The slice base receiving plate 240 at the side of the substrate portion 110a has the same shape as the substrate portion 110a (arc), and the width thereof is slightly larger than that of the slice base 110b.

And, two guides 245 and 245 are fixed to the lower surface of the upper plate 231b at the side of the slice base in the vicinity of the air cylinder 233, and the guides 245 and 245 are supported with the removable vertically 246, 246 so as to be movable vertically and forced downward by a compression spring 248. A claw 247 is placed at the upper side of the pusher 246.

A basket 249 is arranged below the clamp base 232.

An explanation will be given of the operation in that the slice base 110b is peeled off from the substrate portion 110a with the wafer slice base peeling system as described above.

When the upper surface of the slice base receiving plate 240 becomes the same as that of the clamp base 232 (the stopper 239 is in contact with the clamp base 232), and further when the wafer 110, which has been washed after slicing, is sent into the predetermined position of the clamp base 232 with conveying means not shown, the clamper 234 lowers, and pushes and fixes the substrate portion 110a to the clamp base 232. When the clamper 234 reaches to the upper end, the pusher 246 is raised by the claw 247, and when the clamper 234 lowers, the pusher 246 is forced downward by the compression spring 248 to push the slice base 110b to the slice base receiving plate 240.

When the substrate portion 110a is fitted to the clamp base 232 by the clamper 234 and the pusher 246 pushes the slice base 110b to the slice base receiving plate for a predetermined time, the slice base receiving plate 240 moves apart from the slice base 110b by the air cylinder 244, so that the pusher 246 is forced more by the compression spring 248 downward and pushes slice base 110b so as to peel the slice base 110b from the substrate portion 110a. The slice base 110b, which has peeled off, falls and is stored in the basket 249.

In this case, a heater 241 is built in the slice base receiving plate 240 so as to keep a predetermined temperature (about 100° C.), and when the substrate portion 110a is contact with the clamp base 213 for a predetermined time, the adhesive for bonding the substrate portion 110a with the slice base 110b becomes high temperature and softens, so that it can be peeled off easily.

Figure 18:
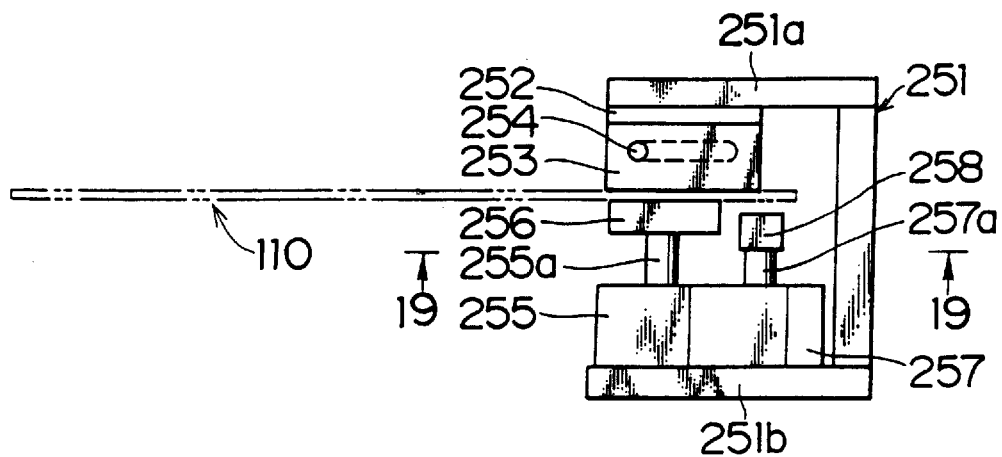
FIG. 18 is a plain view showing an essential portion of the fourth embodiment according to the present invention; and, FIG. 19 is a sectional view taken on the line 19—19 in FIG. 18.
Figure 19:
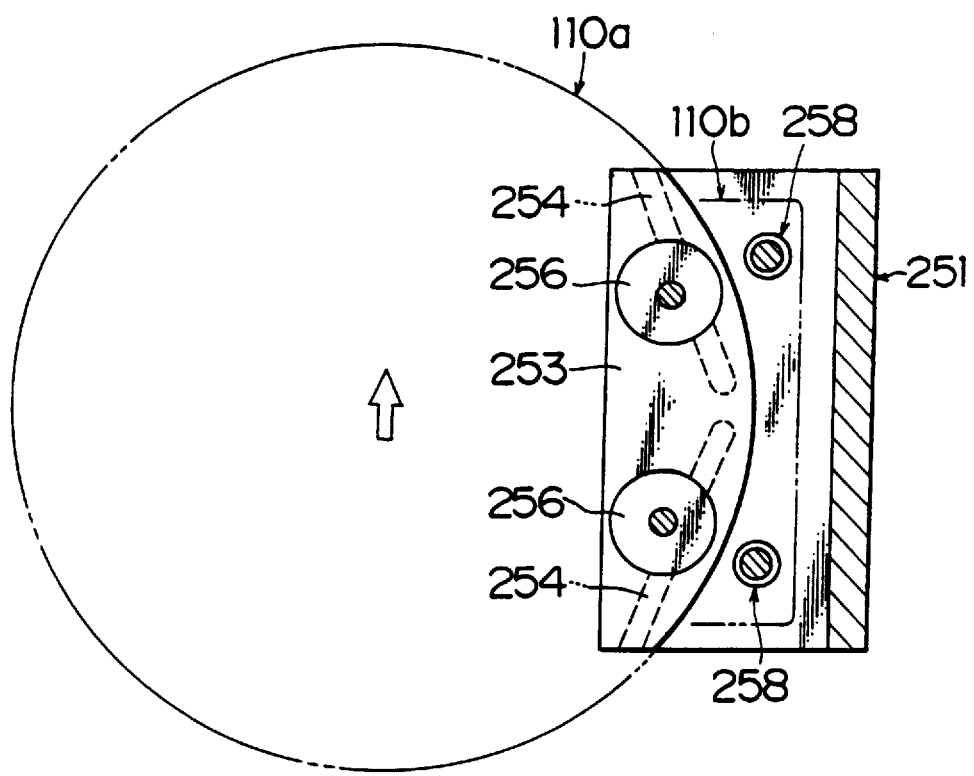

FIGS. 18 and 19 show the essential portions of the fifth embodiment of the wafer slice base peeling system according to the present invention. The fifth embodiment has the same heating method as the second embodiment. The fifth embodiment differs in the positioning/conveying direction of the wafer 110 from the second embodiment. In the second embodiment, the thickness direction of the wafer 110 is vertical and the conveying direction is horizontal, that is, the direction of the slice base 110b, in the fifth embodiment, however, the thickness direction of the wafer 110 is horizontal and the conveying direction is vertical, that is, perpendicular to the slice base 110b. The fifth embodiment is the same as the second embodiment in the whole structure. FIG. 18 is a plain view, and FIG. 19 is a sectional view taken on the line 19—19 in FIG. 18. FIG. 18 shows a state in that the wafer 110 is fixed before peeling off from a slice base 110b.

In FIGS. 18 and 19, a clamp base 253 is fixed to an internal surface of a side plate 251a of an U-shaped base 251 through a heat insulating plate 252, and a heater 253 is built in for heating at a predetermined temperature. The clamp base 253 at the side of the slice base 110b has the same shape as the substrate portion 110a (an arc), the width thereof is slightly larger than that of the slice base 110b. And, two air cylinders 223, 223 are attached to the internal surface of the side plate 251b at the side of the clamp base 253, and a clamper 256 is attached to each piston 255a of the air cylinder 255. Further, two air cylinders 267, 267 are fixed to the internal surface of the side plate 251b at the side of the slice base 110b in the vicinity of the air cylinder 225, and a pusher 258 is attached to each piston 257a of the air cylinder 257.

An explanation will be given of the operation in that the slice base 110b is peeled off from the substrate portion 110a with the wafer slice base peeling system as described above.

When the wafer 110, which has been washed after slicing, is sent into the predetermined position of the clamp base 253 with conveying means not shown, the clamper 256 pushes and fixes the substrate portion 110a to the clamp base 253. When the clamper 256 fixes the substrate portion 110a to the clamp base 253 for a predetermined time, the pusher 258 pushes the slice base 110b so as to peel the slice base 110b from the substrate portion 110a. The slice base 110b, which has peeled off, falls and is stored in a basket or the like, not shown.

In this case, just as in the second embodiment, a heater 254 is built in the clamp base 253 for keeping a predetermined temperature (about 100° C.), and when the substrate portion 110a is in contact with the clamp base 253 for a predetermined time, the adhesive for bonding the substrate portion 110a with the slice base 110b reaches at a high temperature and softens, so that it can be peeled off easily.

Further, in the fifth embodiment, the clamp base 253 is arranged only in the vicinity of the slice base 110b, however, the clamp base 253 may be formed to cover the entire substrate portion 110a so as to heat the entire substrate portion 110a.

And, the present invention is not limited to the positioning/conveying direction of the wafer 110.

That is, in the second, third and forth embodiments, the explanation has been given in the case that the wafer 110 is conveyed in the direction of the slice base 110b. However, the present invention should not be limited to this, the wafer 110 is conveyed in the direction perpendicular to this direction. In this case, the base 211, the base 221 and the base 231 are formed in U-shapes such as in the fifth embodiment. Further, in the third and forth embodiments, the thickness direction of the wafer 110 is vertical and the wafer 110 is conveyed horizontally, however, the present invention should not be limited to this, in the fifth embodiment, the thickness direction of the wafer 110 may be horizontal and the wafer 110 may be conveyed vertically. And, when the wafer 110 is conveyed vertically (including the fourth embodiment), the wafer 110 may be conveyed in the direction of the slice base 110b or in the direction perpendicular to this.

Further, in all embodiments, clampers 216, 224, 234 and 256 are provided by twos, the second, third and fifth embodiments should not be limited to this, one clamper may be arranged near the center.

And, in all embodiments, pushers 218, 226, 246 and 258 are provided by twos, the present invention should not be limited to this, one pusher may be formed so as to cover the entire slice base 110b. In this case, as shown in the prior art, a guide for the pusher is needed in addition to the air cylinder.

Moreover, the explanation has been given of the case that the clampers 216, 224, 234 and 256 and the pushers 218, 226, 246 and 258 are driven by the air cylinder, however, another driving means may be acceptable. The slice base receiving plate 240 is also driven similarly.

It should be understood, however, that there is no intention to limit the invention to the specific forms disclosed, but on the contrary, the invention is to cover all modifications, alternate constructions and equivalents falling within the spirit and scope of the invention as expressed in the appended claims.

We claim:

1. A wafer slice base peeling system comprising:

a clamp base for receiving a substrate portion of a wafer;

a clamper for fixing said substrate portion to said clamp base;

a pusher arranged near said clamper at a side of a slice base, which is adhered to said substrate portion of said wafer, for pushing said slice base;

a nozzle placed between said clamper and said pusher and provided with a blow-off opening to a boundary portion between said substrate portion and said slice base; and, hot air generating means connected with said nozzle for generating hot air at a predetermined temperature.

2. A wafer slice base peeling system as set forth in claim 1, wherein said blow-off opening of said nozzle is shaped in about the same shape as a boundary shape between said substrate portion of said wafer and said slice base.

3. A wafer slice base peeling system as set forth in claim 1, wherein said hot air generating means generates hot air at a temperature so as to soften an adhesive for bonding said substrate portion of said wafer and said slice base.

* * * * *